(12) United States Patent  
Nakayama et al.

(10) Patent No.: US 7,140,321 B2  
(45) Date of Patent: Nov. 28, 2006

(54) PLASMA PROCESSING APPARATUS AND METHOD

(75) Inventors: Tomio Nakayama, Ibaraki (JP); Hirohisa Oda, Ibaraki (JP); Hitoshi Ishihama, Ibaraki (JP); Kazumichi Kuramochi, Ibaraki (JP); Junya Takahashi, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 10/725,403

(22) Filed: Dec. 3, 2003

(65) Prior Publication Data

US 2004/0118520 A1    Jun. 24, 2004

(30) Foreign Application Priority Data

Dec. 3, 2002    (JP)    ............................. 2002-351756

(51) Int. Cl.
```
C23C 16/00      (2006.01)
C23F 1/00       (2006.01)
H01L 21/306     (2006.01)
H01J 7/24       (2006.01)
H05B 31/26      (2006.01)
```
(52) U.S. Cl. .................... 118/723 MW; 156/345.36; 156/345.41; 315/111.21
(58) Field of Classification Search ....... 118/723 MW; 156/345.36, 345.41, 345.42, 345.46, 345.49
See application file for complete search history.

(56) References Cited

U.S. PATENT DOCUMENTS 6,059,922 A    5/2000   Yamazaki et al. .......... 156/345  
6,729,261 B1 *  5/2004  Hongo ............... 118/723 MW  
6,736,930 B1 *  5/2004  Hongoh ................. 156/345.41  
2002/0193034 A1 * 12/2002 Ota .............................. 445/16

FOREIGN PATENT DOCUMENTS

| JP | 02302507 A | * | 12/1990 |
| JP | 8-274067 | | 10/1996 |
| JP | 10-340892 | | 12/1998 |

* cited by examiner

Primary Examiner—Parviz Hassanzadeh  
Assistant Examiner—Rakesh K Dhingra  
(74) Attorney, Agent, or Firm—Fitzpatrick, Cella, Harper & Scinto

(57) ABSTRACT

A plasma processing apparatus includes a vacuum chamber that accommodates an object to be processed, and provides a plasma process to the object in a vacuum or reduced pressure environment, a dielectric for transmitting microwaves to the vacuum chamber and for maintaining the vacuum or reduced environment of the vacuum chamber, a plate that has slots for guiding the microwaves to the dielectric, and a temperature control mechanism that has a cooling channel between the plate and the dielectric, and controls temperature of the dielectric.

14 Claims, 5 Drawing Sheets

PLASMA PROCESSING APPARATUS AND METHOD

This application claims a benefit of priority based on Japanese Patent Application No. 2002-351756, filed on Dec. 3, 2002, which is hereby incorporated by reference herein in its entirety as if fully set forth herein.

BACKGROUND OF THE INVENTION

The present invention relates generally to plasma processing using plasma generated from the microwaves, and more particularly to cooling of a dielectric that transmits the microwaves into a plasma process chamber and maintains the reduced pressure or vacuum environment in the plasma process chamber.

A manufacture of semiconductor devices that forms devices on a semiconductor single crystal substrate ("substrate"), such as silicon, includes the steps of applying photosensitive resin onto a substrate surface using a coater, exposing and transferring a pattern on a previously prepared mask (reticle) using an exposure apparatus, and developing the resultant substrate using a developing machine, thereby obtaining a desired transfer pattern of photosensitive resin. This transfer pattern is used as a mask for subsequent steps of etching, diffusion, film formation, etc., so as to perform a desired process for a substrate, etc., and form devices.

The semiconductor process step inevitably requires a plasma processing apparatus having a high processing speed and damage resistance for improved productivity. A method that introduces the microwaves into dielectric through slots in a metal plate and generates high-density plasma on a dielectric surface at the vacuum side, have recently been proposed as a means to achieve required high processing speed and damage resistance.

A conventional plasma processing apparatus typically supplies the microwaves from a microwave source to a plasma process chamber that accommodates a semiconductor substrate as an object to be processed, through a metal plate having slots and a dielectric. The plasma process chamber is maintained in the reduced pressure or vacuum environment, and supplied with reaction gases. The reaction gases turn into highly active radials and ions by plasma, and react with and plasma-process the semiconductor substrate. The dielectric serves to transmit the microwaves to the plasma process chamber, and maintain the reduced pressure or vacuum environment in the plasma process chamber. The metal plate serves to introduce the microwaves into the dielectric through its slots, prevent the dielectric from liberating and mixing as impurities with the gases, and make the plasma distribution uniform. Such a plasma processing method can generate microwave induced high-density plasma on the dielectric surface at the vacuum side, and is promising method for generating high-density plasma in a large area.

However, the conventional plasma processing method has been disadvantageous in that the dielectric becomes high temperature due to the received heat during the plasma generation. This temperature rise of the dielectric and the lowered temperature just after the apparatus becomes idle, fluctuate process characteristics, and cause malfunctions of the apparatus.

The process characteristics include, for example, the following disadvantages: Photoresist forms a hard layer as a degenerated surface after high-concentration ion implantation, and thus a phenomenon that pops resist, i.e., "popping" occurs when the wafer is heated above the resist bake temperature after the lithography step. The popping resist due to heating remains on the wafer even after over ashing, and greatly affects the remaining chip yield. Therefore, ashing after the high-concentration ion implantation should be processed by maintaining the wafer temperature below the resist bake temperature after the lithography step. In the process using an apparatus that does not have a temperature control function over the dielectric, the dielectric temperature rises whenever the above process step repeats, and the processed wafer becomes above the resist bake temperature due to the radiation heat from the dielectric after the lithography step, whereby the popping occurs disadvantageously.

On the other hand, the apparatus includes, for example, the following malfunctions: The vacuum processing apparatus that uses the dielectric employs a sealer between the dielectric and a process-chamber component to maintain the vacuum against the outside. In general, this sealer utilizes a fluororubber system sealer, a perfluoro system elastomeric sealer etc., but the highest service temperature is below 200° C. due to the physical properties of the material. Therefore, in the apparatus that does not use a temperature control function over the dielectric, the dielectric temperature rises whenever the process repeats, the dielectric temperature rises above the highest service temperature of the sealer, and the sealer cannot serve to maintain the vacuum. In addition, when the apparatus that does not have a temperature control function of the dielectric is used after long idling, the dielectric and an inner wall of a dielectric holder are below the temperature at which sublimate generated from the processed wafer and reaction products turns from gas to solid, and thus will suffer from depositions since they are not exhausted in the gas state. The reattachment of the cumulative deposition to the processed wafer would greatly lower the chip yield.

BRIEF SUMMARY OF THE INVENTION

Accordingly, it is an exemplary object of the present invention to provide a plasma processing apparatus and method that provide a high-quality plasma process to an object while preventing influence of the dielectric due to the received heat.

A plasma processing apparatus of one aspect according to the present invention includes a vacuum chamber that accommodates an object to be processed, and provides a plasma process to the object in a vacuum or reduced pressure environment, a dielectric for transmitting microwaves to the vacuum chamber and for maintaining the vacuum or reduced environment of the vacuum chamber, a plate that has slots for guiding the microwaves to the dielectric, and a temperature control mechanism that has a cooling channel between the plate and the dielectric, and controls temperature of the dielectric.

An interval between the plate that forms the cooling channel and the dielectric may be equal to or smaller than 2 mm. The cooling channel may be supplied with coolant. The coolant may include at least one of air, nitrogen, inactive gas, Fluorinert®, Galden® and fluorine included solution. The coolant may include gas, liquid or a low dielectric loss material. The cooling channel may be exhaustibly supplied with coolant.

The plasma processing apparatus may further include a temperature detector for measuring the temperature of or near the dielectric, and a controller for controlling a flow rate of coolant based on the temperature detected by the temperature detector, the coolant being supplied to the cooling channel. The cooling channel may arrange a heat conductive medium. The heat conductive medium may be arranged around the dielectric. The heat conductive medium may include silicon powder or silicon oil. The heat conductive medium may be a high dielectric loss material.

The plate may be made of a material that includes at least one of aluminum, gold, silver and copper. The dielectric may be made of a material that includes at least one of alumina-ceramic, aluminum nitride and quarts. The plasma processing apparatus may further include a waveguide for guiding the microwaves to the plate, the waveguide forming plural holes in place which allow the coolant to pass through the holes and prevent the microwaves from transmitting through the holes, and a partition, formed on the waveguide between the place of the waveguide and a microwave source for supplying the microwaves, for preventing the coolant from moving along the waveguide to the microwave source. The partition may be made of a high dielectric loss material.

A plasma process method of another aspect according to the present invention for plasma-processing an object to be processed which is accommodated in a vacuum chamber in a vacuum or reduced pressure environment includes the steps of detecting temperature near a dielectric that maintains the vacuum or reduced pressure environment of the vacuum chamber as well as transmitting microwaves to the vacuum chamber, and controlling a flow rate of coolant in a cooling channel arranged between the dielectric and a plate having slots that guide the microwaves into the dielectric, based on a detection result by the detecting step.

Other objects and further features of the present invention will become readily apparent from the following description of the preferred embodiments with reference to accompanying drawings.

DETAILED DESCRIPTION OF THE PREFERRED EMBODIMENTS

Figure 1:
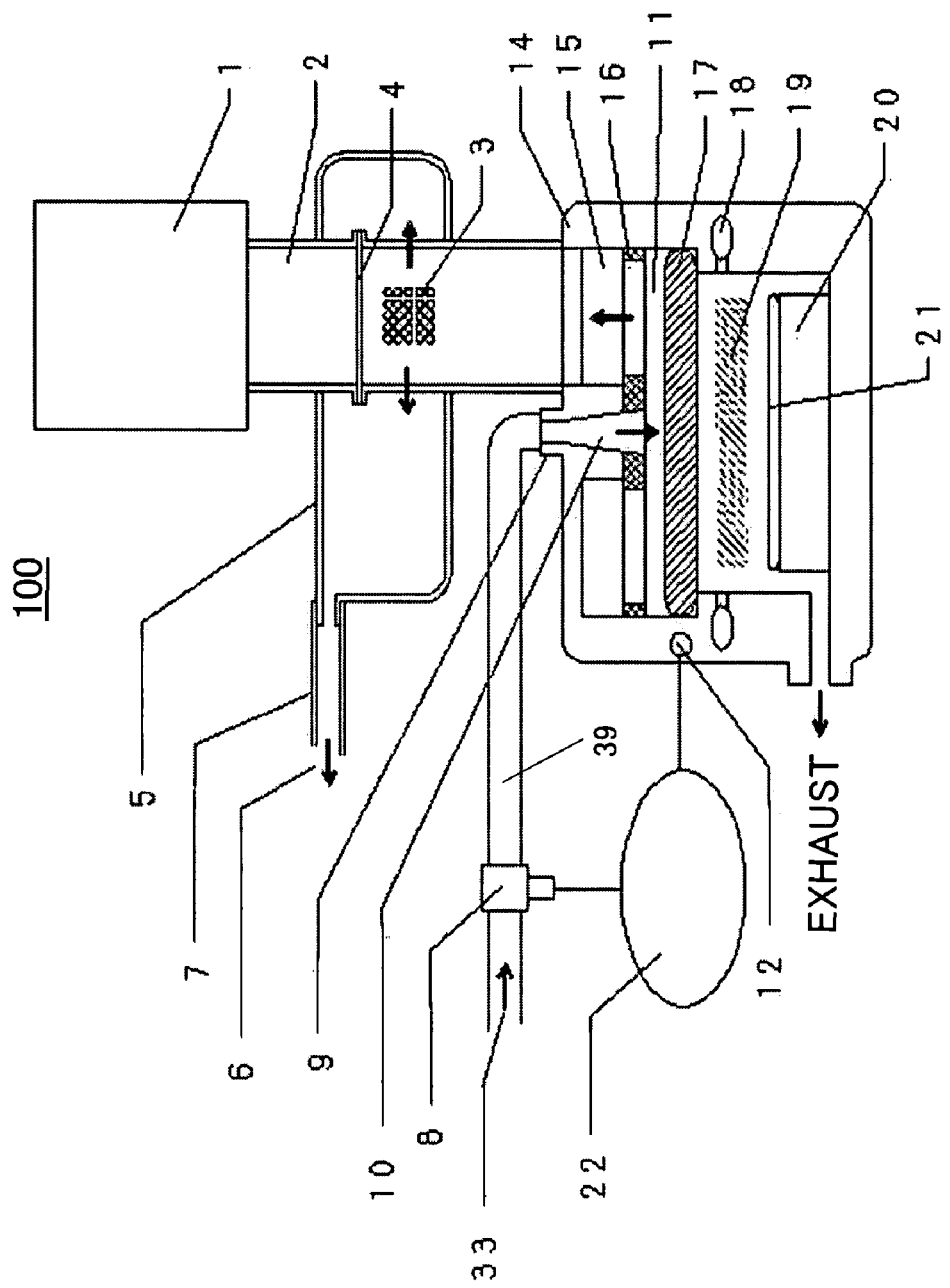
FIG. 1 is a schematic sectional view showing a structure of a plasma processing apparatus as one embodiment according to the present invention.
Figure 2:
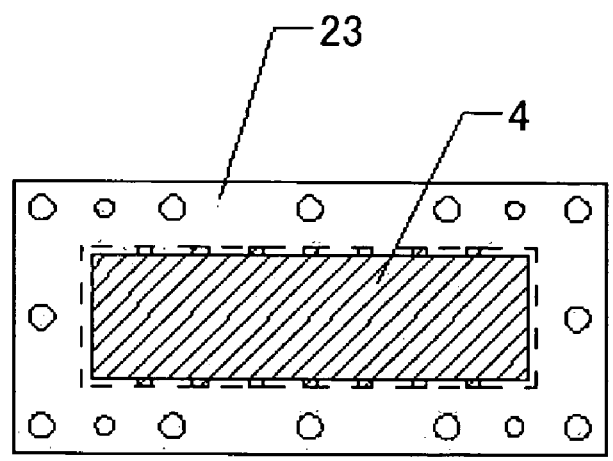
FIG. 2 is a plane view of a partition sheet at a joint part of a waveguide in the plasma processing apparatus shown in FIG. 1.
Figure 3:
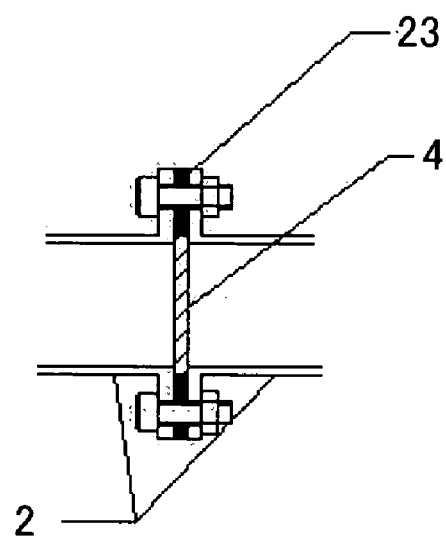
FIG. 3 is a side view near the partition sheet shown in FIG. 2.
Figure 4:
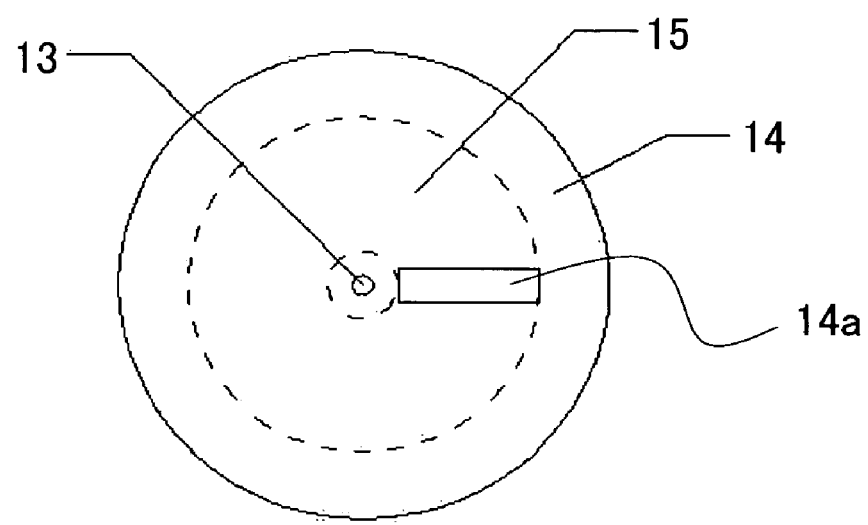
FIG. 4 is a transparent plane view of a microwave supply unit in the plasma processing apparatus shown in FIG. 1.
Figure 5:
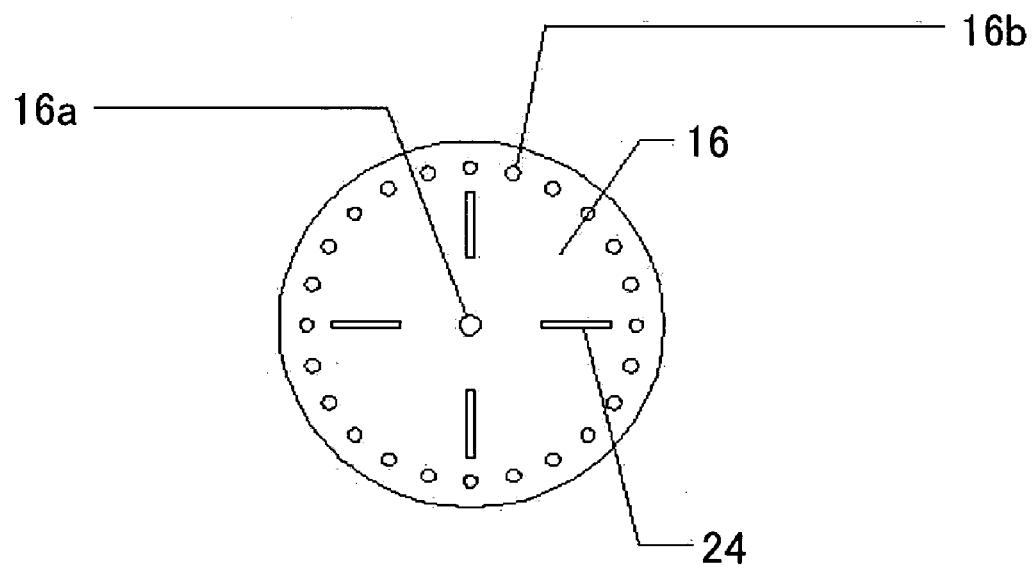
FIG. 5 is a plane view of a metal plate in the plasma processing apparatus shown in FIG. 1.

A description will be given of a plasma processing apparatus 100 of one embodiment according to the present invention with reference to accompanying drawings. Here, FIG. 1 is a schematic sectional view showing a structure of the plasma processing apparatus 100. FIGS. 2 and 3 are plane and side views, respectively, of a microwave resistant, partition sheet 4 provided at a joint part in a waveguide 2. FIG. 4 is a transparent plane view of a microwave supply unit 14. A broken line indicates an annular waveguide channel 15, and a square hole denotes a bond surface of the waveguide 2. FIG. 5 is a plane view of a metal plate 16 having a rectangular opening. The plasma processing apparatus 100 of the instant embodiment uses the microwaves to provide a predetermined plasma process, such as etching, film formation, resist ashing, doping, sintering, and surface modification process, to a semiconductor substrate 21 as an object to be processed.

The plasma processing apparatus 100 includes a microwave oscillator 1, a waveguide 2, a microwave supply unit 14, a metal plate 16, a dielectric 17, and a gas supply channel 18.

The microwave oscillator 1 is, for example, a magnetron that oscillates regulated microwaves, and generates microwaves of 2.45 GHz. The microwave is converted into a predetermined mode, such as a TM mode, and propagates through the waveguide 2. FIG. 1 omits an isolator that absorbs reflected waves as the generated microwaves that return to the microwave oscillator 1, an impedance mathcing unit for matching with the load side, and a gate valve for receiving the object 21 from and feeding the object 21 to a load lock chamber (not shown).

The waveguide 2 serves to guide the microwaves to the microwave supply unit 14, and is connected to an exhaust mechanism of coolant 33, which will be described later. The exhaust mechanism includes holes 3, a partition sheet 4, a sealer 5, and an exhaust hose 7.

The holes 3 are provided in a surface of the waveguide 2 at the side of the microwave supply unit 14 when viewed from the partition sheet 4, and are so many fine holes, for example, below Φ10 mm, e.g., Φ3 mm in the instant embodiment that they do not leak the microwaves from the waveguide 2.

The partition sheet 4 is provided at the joint part of the waveguide 2, and made of a low dielectric defect material, such as a PTFE sheet with a thickness of 3 mm. As shown in FIG. 2, the partition sheet 4 is held by an electrically conductive gland 23 and a fastener part on a mating surface of the waveguide 2. A shape inside the gland 23 needs to be the same as a sectional shape of the waveguide 2. In the instant embodiment, as shown in FIG. 2, a shape inside the gland 23 fits a shape in the waveguide 2. Since the partition sheet 4 should be held, the holder part preferably has such a size of several millimeters that the holder part does not negatively affect propagations of the microwaves. In the instant embodiment, the gland 23 externally projects with a width of 3 mm, and has a dent with a length of about 3 mm to hold the partition sheet 4. The partition sheet 4 cools the dielectric 17, and prevents high-temperature coolant 33 from thermally negatively affecting the microwave oscillator I and an impedance matching unit (not shown).

The sealer 5 seals the holes 3. the exhaust hose 7 is located onto the seaaler 5, and exhausts the coolant 33 through an exhaust port 6.

The microwave supply unit 14 supplies the microwaves to the plasma process chamber 19 formed in it, turns gases into plasma via the gas supply channel 18, and plasma-processes the semiconductor substrate 21 accommodated in the plasma process chamber 19 and held by the semiconductor substrate holder means 20. The plasma process chamber 19 is maintained in a reduced pressure or vacuum environment by exhaust means (not shown).

The microwave supply unit 14 includes an annular waveguide channel 15 connected via the rectangular opening 14a, a metal plate 16, and a dielectric 17 in order to supply the microwave to the plasma process chamber 19.

The plasma process plasma processing apparatus 100 includes a cooling mechanism for cooling the dielectric 17.

The metal plate 16 has rectangular openings or slots 24, as shown in FIG. 5, in order to guide the microwaves to the dielectric 17, and is made, for example, of aluminum, gold, silver, copper, etc. The metal plate 16 serves to prevent the dielectric 17 from liberating and mixing as impurities with gases, and to make uniform the plasma distribution. As discussed below, the plate 16 has a hole 16a at its center for introducing the coolant 33, and plural holes 16b at its outer peripheral, each of which has a shape that does not affect the microwave and serves to exhaust the coolant 33, so that the coolant 33 is introduced from the microwave supply unit 14 to the top surface of the dielectric 17.

The dielectric 17 transmits the microwave to the plasma process chamber 19, and maintains the reduced pressure or vacuum environment of the plasma process chamber 19. The dielectric 17 is made, for example, of alumina-ceramics, aluminum nitride, quartz, etc.

The cooling mechanism for the dielectric 17 includes, as shown in FIG. 1, a valve 8, a coolant inlet channel 10, a coolant channel 11, a temperature detector 12, a controller 22, and a pipe 39. The coolant inlet channel 10 is provided at the center of the microwave supply unit 14 having the annular waveguide channel 15 through a joint 9, and introduces the coolant 33 into the coolant channel 11. As shown in FIG. 5, a center of the plate 16 also forms the hole 16a for introducing the coolant 33.

The instant embodiment sets an interval below 2 mm between the plate 16 and the dielectric 17, or a thickness of the coolant channel 11. The coolant 33 radially expands in the space in the coolant channel 11, radiates the heat from the dielectric 17, flows into the upper annular waveguide channel 15 through the hole 16a and outer peripheral holes 16b of the plate 16, and reaches the waveguide 2 via the annular waveguide channel 15. As a result, the coolant 33 cools the plate 16 and prevents the thermal deformations of the slots 24.

The partition sheet 4 prevents the coolant 33 that has flowed into the waveguide 2 from further flowing to the microwave oscillator 1 side in the waveguide 2. The coolant 33 is exhausted external to the waveguide 2 through holes 3 with Φ3 mm. The coolant 33 is exhausted to the outside of the plasma processing apparatus 100 through the sealer 5, hose 7, and exhaust port 6. Since the coolant 33 becomes high temperature due to heat exchange with the dielectric 17 at this time, it is preferably treated and exhausted as a high-temperature medium.

The temperature control mechanism of the dielectric 17 includes the valve 8, temperature detector 12, the controller 22, and a memory (not shown). The temperature detector 12 is provided near the dielectric 17 in the plasma process chamber 19, and supplies to the controller 22 a detection signal indicative of the temperature near the dielectric 17. The controller 22 controls an action of each component, particularly opening and closing and an opening amount of the valve 8 based on the temperature control method stored in the memory (not shown) in the instant embodiment. In this case, the set temperature of the controller is preferably above the temperature for preventing depositions of the sublimate and reaction products that would otherwise occur during the process as well as below the temperature for preventing a rise of the dielectric temperature, which deteriorates the process characteristics.

The temperature control method stored in the memory (not shown) includes a flow that includes the steps, for example, of determining whether the temperature detector 12 detects the predetermined temperature, and controlling opening and closing of the valve 8 on the coolant supplying pipe 39 connected to the microwave supply unit 14 when determining that the temperature detector 12 detects the predetermined temperature. More specifically, the controller 22 determines whether the detection signal from the temperature detector 12 is lower or higher than the preset temperature, and sends to a valve opening/closing controller, when determining that it is higher, a signal that controls opening/closing of the valve 8 and the opening amount, thereby regulating the flow amount of the coolant 33. The valve opening/closing controller may be integrated with the controller 22.

Since the temperature control mechanism in the instant embodiment introduces the coolant 33 into the coolant channel 11 only when the dielectric 11 exceeds the preset temperature, the temperature of the dielectric 17 may be maintained constant and the heat deformation, etc. of the dielectric 17 may be prevented. The controller 22 may adjust the flow amount of the coolant 33 to be exhausted by the hose 7. As a result, the controller 22 may control both the inlet amount of the coolant 33 to the coolant channel 11 and its exit amount from the coolant channel 11.

The coolant 33 may use, irrespective of gas, liquid or low dielectric loss material, air, nitrogen, inactive gas, Fluorinert®, Galden® and fluorine included solution, such as HFE.

The gas feed channel 18 is supplied with reaction gas, such as $NH_3$ and NO, and discharge gas, such as Xe and Ar. The gas feed channel 18 is connected, for example, to a gas source, a valve, a mass flow controller.

Figure 6:
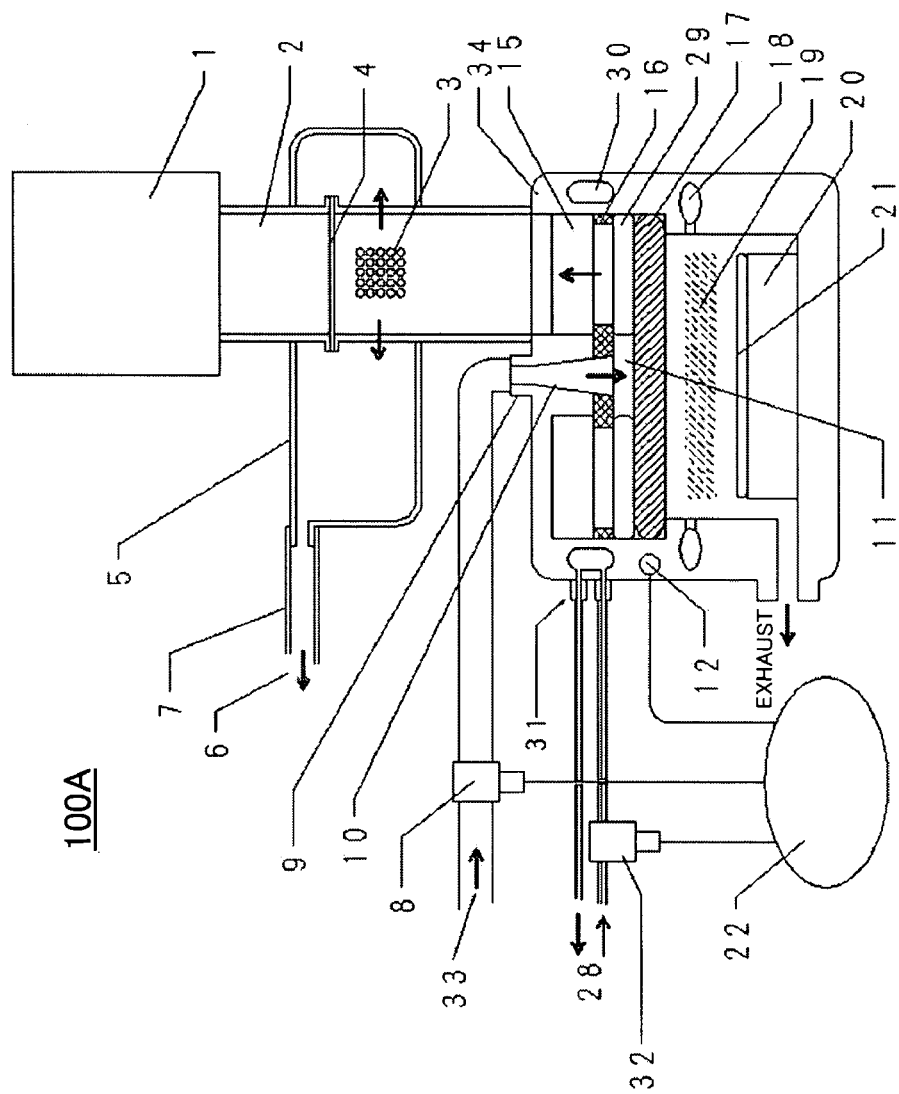
FIG. 6 is a schematic sectional view showing a structure of a plasma processing apparatus as another embodiment according to the present invention.
Figure 7:
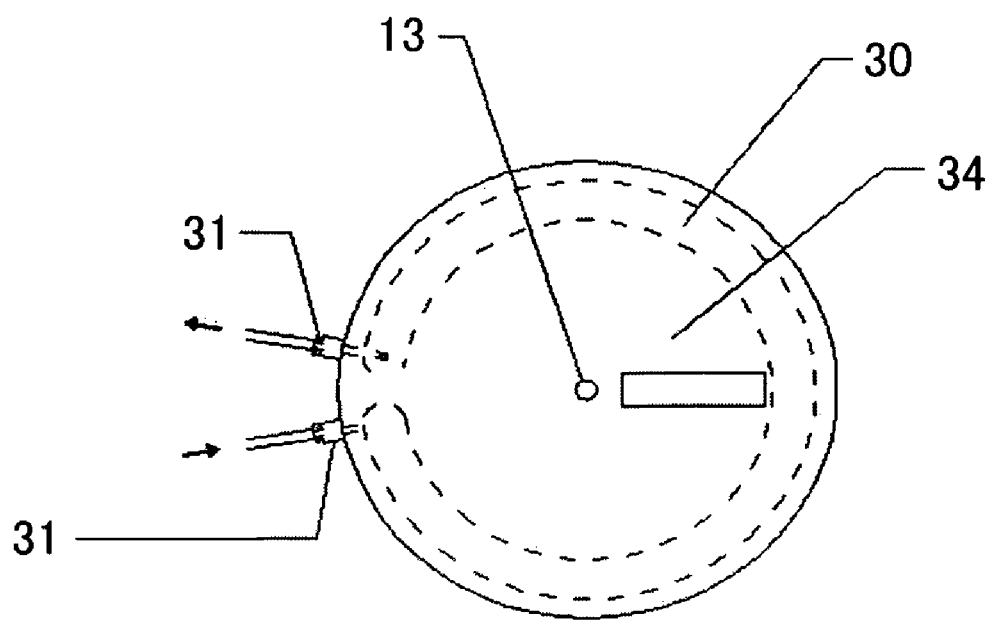
FIG. 7 is a transparent plane view of a microwave supply unit in the plasma apparatus shown in FIG. 6.
Figure 8:
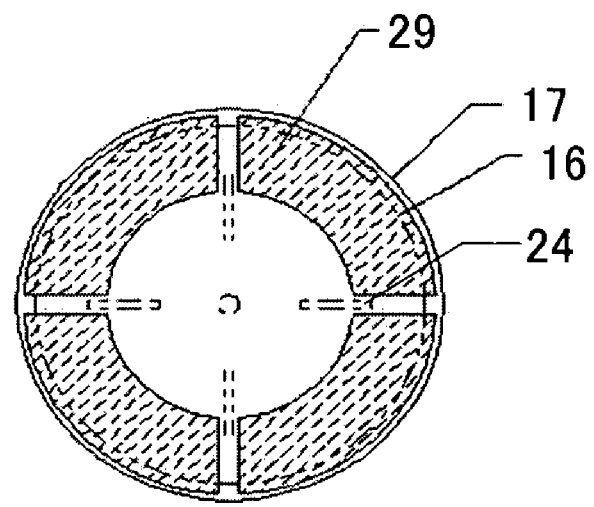
FIG. 8 is a plane view of a heat conductive medium sheet in the plasma apparatus device shown in FIG. 6.

A description will now be given of the plasma processing apparatus 100A of another embodiment according to the present invention with reference to FIGS. 6 to 8. Here, FIG. 6 is a schematic sectional view of the plasma processing apparatus 100A. FIG. 7 is a plane view of the microwave supply unit 34. As illustrated, the microwave supply unit 34 includes a cooling channel 30 and joints 31 at the inlet and outlet sides. FIG. 8 is a plane view of the heat conductive medium sheet 29 on the dielectric 17 and an opening position of the metal plate 16. Those elements in the plasma processing apparatus 100A are designated by the same reference numerals, and a duplicate description thereof will be omitted.

The plasma processing apparatus 100A of the instant embodiment arranges comprises the heat conductive medium sheet 29 in the space in the coolant channel 11. The sheet 29 is heatproof and made of a material having high heat conductivity, such as silicon powder and silicon oil. As shown in FIG. 8, the sheet 29 is arranged around the peripheral of the dielectric 17 so as not to close the slots 24 in the plate 16.

The coolant 33 that has passed through the coolant inlet channel 10 externally flows from the center of the dielectric 17, and possibly causes a difference in cooling efficiency between the center and the peripheral of the dielectric 17. The thermal storage difference of the dielectric 17 is greatly proportionate to the plasma processing time.

The instant embodiment provides the sheet 29 that has good heat conductivity outside the dielectric 17, allowing the heat external to the dielectric 17 to transmit to the plate 16, and improving the heat exchange efficiency of the coolant 33. The microwave supply unit 34 radiates the heat.

The microwave supply unit 34 forms the cooling channel 30, as shown in FIG. 7, so as to enclose the inside. The cooling channel 30 is connected to the pipe 28 via the joints 31 for circulation of the cooling water in the microwave supply unit 34. The cooling channel 30 radiates the heat external to the dielectric 17 from the heat conductive medium sheet 29 via the plate 16, and thus is preferably provided near the plate 16.

The temperature information detected by the temperature detector 12 near the dielectric 17 is sent to the controller 22, and opening/closing of the valve 32 on the pipe 28 is controlled based on the preset temperature. Opening/closing of the valve 8 on the coolant pipe 39 is similarly controlled. Thereby, the instant embodiment may reduce and maintain constant a difference between the center and the outside of the dielectric 17 even for the long plasma processing time.

A description will now be given of the operations of the plasma processing apparatuses 100 and 100A. Initially, a carrier arm (not shown) carries the semiconductor substrate 21 into the semiconductor substrate holder means from a load lock chamber (not shown). In this state, the load lock chamber (not shown) and the plasma process chamber 19 are maintained, for example, in the vacuum or reduced pressure environment. The gate valve (not shown) then closes, and the plasma process chamber 19 is sealed. If necessary, the height of the holder means 21 is adjusted. The valve (not shown) of the gas supply channel 18 then opens to introduce predetermined gas into the plasma process chamber 19.

Then the microwave oscillator 1 supplies the microwave supply units 14 and 24 with the microwaves via the waveguide 2. The microwave supply units 14 and 34 turn the gas into plasma, which has been introduced into the plasma process chamber 19, and the plasma is used to process the semiconductor substrate 21. As a result, a preset process, such as a film formation with a predetermined thickness, is performed for the semiconductor substrate 21.

When the temperature detector 12 detects that the temperature of the dielectric 17 reaches the predetermined temperature during the plasma process, the controller 22 opens the valves 8 and 32 to introduce the coolant 33 and cooling water to cool the dielectric 17 and plate 16, thereby preventing the dielectric 17 and the plate 16 from deteriorating their characteristics due to the heat.

Thereafter, the semiconductor substrate 21 is taken out of the plasma process chamber 19 to the load lock chamber via the gate valve (not shown) in a procedure reverse to the above. The semiconductor substrate 21 taken out of the plasma process chamber 19 is then fed to the ion implantation apparatus in the next stage, if necessary.

Thus, the cooling means of the dielectric 17 of the instant embodiment may mitigate the variance of the process characteristics of the dielectric 17 due to the heat received from the plasma, and improves the process characteristics of the plasma processing apparatuses 100 and 100A used for etching, film formation, resist removal of the semiconductor substrate 21.

Thus, the present invention may provide a plasma processing apparatus and method that provide a high-quality plasma process to an object while preventing influence of the dielectric due to the received heat.

What is claimed is:

1. A plasma processing apparatus comprising:
    a vacuum chamber that accommodates an object to be processed, and provides a plasma process to the object in a vacuum or reduced pressure environment;
    a dielectric for transmitting microwaves to said vacuum chamber and for maintaining the vacuum or reduced environment of said vacuum chamber;
    a plate that has slots for guiding the microwaves to said dielectric; and
    a temperature control mechanism that has a cooling channel between said plate and said dielectric, and controls temperature of said dielectric,
    wherein the cooling channel comprises a heat conductive medium therein, and
    wherein the heat conductive medium is arranged on the surface of said dielectric, on a peripheral portion of said dielectric in a ring shape so as not to close the slots in the plate.

2. A plasma processing apparatus according to claim 1, wherein an interval between said plate that forms the cooling channel and said dielectric is equal to or smaller than 2 mm.

3. A plasma processing apparatus according to claim 1, wherein the cooling channel is supplied with coolant.

4. A plasma processing apparatus according to claim 3, wherein the coolant includes at least one of air, nitrogen, inactive gas, Fluorinert®, Galden ® and fluorine included solution.

5. A plasma processing apparatus according to claim 3, wherein the coolant includes gas, liquid or a low dielectric loss material.

6. A plasma processing apparatus according to claim 3, further comprising:
    a waveguide for guiding the microwaves to said plate, wherein plural holes are formed in apart of said waveguide, such that the coolant is allowed to pass through the holes and such that the microwaves are prevented from transmitting through the holes; and
    a partition, formed on said waveguide between the part of said waveguide having the holes and a microwave source for supplying the microwaves, for preventing the coolant from moving along said waveguide to the microwave source.

7. A plasma processing apparatus according to claim 6, wherein said partition is made of a high dielectric loss material.

8. A plasma processing apparatus according to claim 1, wherein the cooling channel is exhaustibly supplied with coolant.

9. A plasma processing apparatus according to claim 1, further comprising:
    a temperature detector for measuring the temperature of or near said dielectric; and
    a controller for controlling a flow rate of coolant based on the temperature detected by said temperature detector, the coolant being supplied to the cooling channel.

10. A plasma processing apparatus according to claim 1, wherein the heat conductive medium includes silicon powder or silicon oil.

11. A plasma processing apparatus according to claim 1, wherein the heat conductive medium is a high dielectric loss material.

12. A plasma processing apparatus according to claim 1, wherein said plate is made of a material that includes at least one of aluminum, gold, silver and copper.

13. A plasma processing apparatus according to claim 1, wherein said dielectric is made of a material that includes at least one of alumina-ceramic, aluminum nitride and quartz.

14. A plasma processing apparatus comprising:
    a vacuum chamber that accommodates an object to be processed, and provides a plasma process to the object in a vacuum or reduced pressure environment;
    a dielectric for transmitting microwaves to said vacuum chamber and for maintaining the vacuum or reduced environment of said vacuum chamber;
    a plate that has slots for guiding the microwaves to said dielectric; and a temperature control mechanism that has a cooling channel between said plate and said dielectric, and controls temperature of said dielectric, wherein the cooling channel is supplied with coolant;

a waveguide for guiding the microwaves to said plate, wherein plural holes are formed in a part of said waveguide, such that the coolant is allowed to pass through the holes and such that the microwaves are prevented from transmitting through the holes; and a partition, formed on said waveguide between the part of said waveguide having the holes and a microwave source for supplying the microwaves, for preventing the coolant from moving along said waveguide to the microwave source, wherein the partition is made of a high dielectric loss material.

\* \* \* \* \*

UNITED STATES PATENT AND TRADEMARK OFFICE
CERTIFICATE OF CORRECTION

| | | |
|---|---|---|
| PATENT NO. | : 7,140,321 B2 | |
| APPLICATION NO. | : 10/725403 | |
| DATED | : November 28, 2006 | |
| INVENTOR(S) | : Tomio Nakayama et al. | |

It is certified that error appears in the above-identified patent and that said Letters Patent is hereby corrected as shown below:

<u>COLUMN 8</u>

Claim 6 Line 25, "apart" should read --a part--.

Signed and Sealed this

First Day of May, 2007

JON W. DUDAS
*Director of the United States Patent and Trademark Office*